US011468922B2

(12) United States Patent
Zheng (10) Patent No.: US 11,468,922 B2
(45) Date of Patent: Oct. 11, 2022

(54) SHIFT REGISTER, DRIVING METHOD THEREOF, GATE DRIVING CIRCUIT AND DISPLAY DEVICE

(71) Applicant: BOE TECHNOLOGY GROUP CO., LTD., Beijing (CN)

(72) Inventor: Can Zheng, Beijing (CN)

(73) Assignee: BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 0 days.

(21) Appl. No.: 17/179,699

(22) Filed: Feb. 19, 2021

(65) Prior Publication Data

US 2021/0174846 A1 Jun. 10, 2021

Related U.S. Application Data

(63) Continuation of application No. 16/645,697, filed as application No. PCT/CN2019/101590 on Aug. 20, 2019, now Pat. No. 10,964,359.

(30) Foreign Application Priority Data

Aug. 24, 2018 (CN) .......................... 201810975394.0

(51) Int. Cl.
*G11C 7/00* (2006.01)
*G11C 7/10* (2006.01)
(Continued)

(52) U.S. Cl.
CPC ............. *G11C 7/1036* (2013.01); *G09G 3/20* (2013.01); *G11C 7/1051* (2013.01);
(Continued)

(58) Field of Classification Search
CPC ..... G11C 19/28; G11C 19/287; G11C 19/182; G09G 2310/0286; G09G 3/3677;
(Continued)

(56) References Cited

U.S. PATENT DOCUMENTS 6,556,646 B1 4/2003 Yeo et al.
9,208,734 B2 12/2015 Qian et al.
(Continued)

FOREIGN PATENT DOCUMENTS

CN 101765876 A 6/2010
CN 103400558 A 11/2013
(Continued)

OTHER PUBLICATIONS

First Office Action dated May 14, 2020, for corresponding Chinese application 201810975394.0.
(Continued)

*Primary Examiner* — Thong Q Le
(74) *Attorney, Agent, or Firm* — Nath, Goldberg & Meyer; Joshua B. Goldberg (57) ABSTRACT

Shift register includes input sub-circuit coupling input terminal to first node responsive to signal of first clock terminal in input stage, control sub-circuit transmitting signal of second clock terminal to intermediate output terminal according to level at first node and controlling potential of third node according to potential of intermediate output terminal and signal of third clock terminal in input, output and reset stages, pull-up sub-circuit coupling second level terminal to final output terminal responsive to potential of intermediate output terminal in output stage, first voltage stabilization sub-circuit stabilizing voltage between final output terminal and third node responsive to signal of next-stage node connection terminal, pull-down transistor having gate electrode coupled to third node, first electrode coupled to first level terminal, and second electrode coupled to final output terminal. First voltage stabilization sub-circuit lowers potential of third node to level lower than signal of first level terminal in reset stage.

20 Claims, 4 Drawing Sheets

(51) Int. Cl.
*G09G 3/20* (2006.01)
*G11C 7/12* (2006.01)
*G11C 7/20* (2006.01)
*G11C 7/22* (2006.01)
*G11C 11/4074* (2006.01)

(52) U.S. Cl.
CPC .............. *G11C 7/1078* (2013.01); *G11C 7/12* (2013.01); *G11C 7/20* (2013.01); *G11C 7/22* (2013.01); *G11C 11/4074* (2013.01); *G09G 2310/0286* (2013.01)

(58) Field of Classification Search
CPC .... G09G 3/20; G09G 2310/08; G09G 3/3266; G09G 2300/0426; G09G 2300/0408; G09G 2300/0809; G09G 2310/0267; G09G 2300/043; G09G 2310/061; G09G 3/3233; G09G 3/3291; G09G 2320/0233; G09G 3/3208; G09G 3/3674; G09G 3/2092; G09G 2300/0842; G09G 2310/0283; G09G 3/3611; G09G 2230/00; G09G 3/32
USPC ..... 345/100, 98, 204, 92, 213, 99, 211, 205, 345/208, 559, 87, 93, 103, 212, 55, 94, 345/96, 10, 102, 214, 28, 564, 60, 76, 84, 345/90; 365/189.12, 230.09, 189.07, 221, 365/189.05, 189.14
See application file for complete search history.

(56) References Cited

U.S. PATENT DOCUMENTS

| | | |
|---|---|---|
| 2013/0027377 A1 | 1/2013 | Yang et al. |
| 2015/0194952 A1 | 7/2015 | Ofuji et al. |
| 2018/0096733 A1* | 4/2018 | Kim .................... G09G 3/20 |

FOREIGN PATENT DOCUMENTS

| | | |
|---|---|---|
| CN | 104167192 A | 11/2014 |
| CN | 104464628 A | 3/2015 |
| CN | 104934071 A | 9/2015 |
| CN | 105185294 A | 12/2015 |
| CN | 205050536 U | 2/2016 |
| CN | 107068106 A | 8/2017 |
| CN | 107204176 A | 9/2017 |

OTHER PUBLICATIONS

International Search Report dated Nov. 27, 2019 corresponding to application No. PCT/CN2019/101590.

* cited by examiner

SHIFT REGISTER, DRIVING METHOD THEREOF, GATE DRIVING CIRCUIT AND DISPLAY DEVICE

TECHNICAL FIELD

The present application relates to the field of display technology, and particularly to a shift register, a driving method thereof, a gate driving circuit and a display device.

BACKGROUND

When the display device is displaying, a plurality of shift registers of a gate driving unit sequentially provide scanning signals to corresponding gate lines. Each shift register outputs an active signal during its output stage and outputs an inactive signal after the output stage. It is expected that there is no threshold loss for the inactive signal output after the output stage.

SUMMARY

The present disclosure provides a shift register, a driving method thereof, a gate driving circuit and a display device.

In one aspect, the present disclosure provides a shift register including: an input sub-circuit coupled to an input terminal of the shift register, a first clock terminal and a first node, and configured to electrically couple the input terminal to the first node in response to a first level signal provided through the first clock terminal in an input stage; a control sub-circuit coupled to the first node, an intermediate output terminal of the shift register, a second clock terminal, a third node, a third clock terminal, a second level terminal for providing a second level signal, and a first level terminal for providing the first level signal, and configured to, in the input stage, an output stage, and a reset stage, transmit a signal provided through the second clock terminal to the intermediate output terminal according to a voltage level at the first node, and control a potential of the third node according to a potential of the intermediate output terminal and a signal provided through the third clock terminal; a pull-up sub-circuit coupled to the intermediate output terminal, a final output terminal of the shift register, and the second level terminal, and configured to electrically couple the second level terminal to the final output terminal in response to the potential of the intermediate output terminal in the output stage; a first voltage stabilization sub-circuit coupled to a next-stage node connection terminal, the final output terminal, and the third node, and configured to stabilize a voltage between the final output terminal and the third node in response to the first level signal provided through the next-stage node connection terminal in the output stage and the reset stage; and a pull-down transistor having a gate electrode coupled to the third node, a first electrode coupled to the first level terminal, and a second electrode coupled to the final output terminal. The first voltage stabilization sub-circuit lowers the potential of the third node to a voltage level lower than the first level signal provided through the first level terminal in the reset stage.

In some embodiments, the first voltage stabilization sub-circuit is further configured to stabilize the voltage between the final output terminal and the third node in response to the first level signal provided through the next-stage node connection terminal in a first pull-down stage after the reset stage.

In some embodiments, the control sub-circuit includes: a second voltage stabilization sub-circuit coupled to the first node, the second node, and the intermediate output terminal, and configured to, in the input stage, electrically couple the first node and the second node, and stabilize a voltage between the second node and the intermediate output terminal; a first pull-up control sub-circuit coupled to the intermediate output terminal, the second node, and the second clock terminal, and configured to, in response to a potential of the second node, transmit the second level signal provided through the second clock terminal to the intermediate output terminal in the input stage and the reset stage, and transmit the first level signal provided through the second clock terminal to the intermediate output terminal in the output stage; and a first pull-down control sub-circuit coupled to the intermediate output terminal, the third node, the third clock terminal, the second level terminal, and the first level terminal, and configured to electrically couple the second level terminal and the third node in response to the potential of the intermediate output terminal in the output stage, and electrically couple the first level terminal to the third node in response to the first level signal provided through the third clock terminal in the input stage and the reset stage.

In some embodiments, the shift register further includes: a second pull-up control sub-circuit coupled to the first clock terminal, the first node, the first level terminal, and a fourth node, and configured to transmit the second level signal provided through the first clock terminal to the fourth node in response to the voltage level at the first node in the output stage, and electrically couple the first level terminal to the fourth node in response to the first level signal provided through the first clock terminal in the first pull-down stage; a third pull-up control sub-circuit coupled to the fourth node, the second level terminal and the intermediate output terminal, and configured to electrically couple the second level terminal and the intermediate output terminal in response to a potential of the fourth node in the first pull-down stage and a second pull-down stage; and a second pull-down control sub-circuit coupled to the intermediate output terminal, the third node, and a fourth clock terminal, and configured to stabilize, in response to the potential of the fourth node and the potential of the intermediate output terminal, a voltage between the third node and the fourth clock terminal in a case where a signal provided through the fourth clock terminal transits from the second level signal in the first pull-down stage to the first level signal in the second pull-down stage.

In some embodiments, the input sub-circuit includes a first transistor, a gate electrode of the first transistor is coupled to the first clock terminal, a first electrode of the first transistor is coupled to the input terminal of the shift register, and a second electrode of the first transistor is coupled to the first node.

In some embodiments, the second voltage stabilization sub-circuit includes a first capacitor and a second transistor. A first terminal of the first capacitor is coupled to the second node, and a second terminal of the first capacitor is coupled to the intermediate output terminal. A gate electrode of the second transistor is coupled to the first level terminal, a first electrode of the second transistor is coupled to the second node, and a second electrode of the second transistor is coupled to the first node.

In some embodiments, the first pull-up control sub-circuit includes a third transistor, a gate electrode of the third transistor is coupled to the second node, a first electrode of the third transistor is coupled to the intermediate output terminal, and a second electrode of the third transistor is coupled to the second clock terminal.

In some embodiments, the pull-up sub-circuit includes a fourth transistor, a gate electrode of the fourth transistor is coupled to the intermediate output terminal, a first electrode of the fourth transistor is coupled to the second level terminal, and a second electrode of the fourth transistor is coupled to the final output terminal.

In some embodiments, the first pull-down control sub-circuit includes a fifth transistor and a sixth transistor. A gate electrode of the fifth transistor is coupled to the intermediate output terminal, a first electrode of the fifth transistor is coupled to the second level terminal, and a second electrode of the fifth transistor is coupled to the third node. A gate electrode of the sixth transistor is coupled to the third clock terminal, a first electrode of the sixth transistor is coupled to the third node, and a second electrode of the sixth transistor is coupled to the first level terminal.

In some embodiments, the first voltage stabilization sub-circuit includes a second capacitor and a seventh transistor. A gate electrode of the seventh transistor is coupled to the next-stage node connection terminal, a first electrode of the seventh transistor is coupled to the final output terminal, a second electrode of the seventh transistor is coupled to a first terminal of the second capacitor, and a second terminal of the second capacitor is coupled to the third node.

In some embodiments, the second pull-up control sub-circuit includes an eighth transistor and a ninth transistor. A gate electrode of the eighth transistor is coupled to the first clock terminal, a first electrode of the eighth transistor is coupled to the first level terminal, and a second electrode of the eighth transistor is coupled to the fourth node. A gate electrode of the ninth transistor is coupled to the first node, a first electrode of the ninth transistor is coupled to the fourth node, and a second electrode of the ninth transistor is coupled to the first clock terminal.

In some embodiments, the shift register further includes a third voltage stabilization sub-circuit coupled to the second level terminal and the fourth node, and configured to stabilize a voltage between the second level terminal and the fourth node.

In some embodiments, the third voltage stabilization sub-circuit includes a third capacitor, a first terminal of the third capacitor is coupled to the fourth node, and a second terminal of the third capacitor is coupled to the second level terminal.

In some embodiments, the third pull-up control sub-circuit includes a tenth transistor, a gate electrode of the tenth transistor is coupled to the fourth node, a first electrode of the tenth transistor is coupled to the second level terminal, and a second electrode of the tenth transistor is coupled to the intermediate output terminal.

In some embodiments, the second pull-down control sub-circuit includes an eleventh transistor, a twelfth transistor and a fourth capacitor. A gate electrode of the eleventh transistor is coupled to the fourth node, a first electrode of the eleventh transistor is coupled to a first terminal of the fourth capacitor, and a second electrode of the eleventh transistor is coupled to a first electrode of the twelfth transistor. A gate electrode of the twelfth transistor and a second terminal of the fourth capacitor are both coupled to the third node, and a second electrode of the twelfth transistor is coupled to the fourth clock terminal.

In some embodiments, the shift register further includes a fourth pull-up control sub-circuit coupled to the fourth node, the second clock terminal, the first node, and the second level terminal, and configured to electrically couple the second level terminal to the first node in response to the potential of the fourth node and the first level signal provided through the second clock terminal in the second pull-down stage.

In some embodiments, the fourth pull-up control sub-circuit includes a thirteenth transistor and a fourteenth transistor. A gate electrode of the thirteenth transistor is coupled to the fourth node, a first electrode of the thirteenth transistor is coupled to the second level terminal, and a second electrode of the thirteenth transistor is coupled to a first electrode of the fourteenth transistor. A gate electrode of the fourteenth transistor is coupled to the second clock terminal, and a second electrode of the fourteenth transistor is coupled to the first node.

In another aspect, the present disclosure provides a driving method of a shift register. The shift register includes: an input sub-circuit coupled to an input terminal of the shift register, a first clock terminal and a first node; a control sub-circuit coupled to the first node, an intermediate output terminal of the shift register, a second clock terminal, a third node, a third clock terminal, a second level terminal for providing a second level signal, and a first level terminal for providing a first level signal; a pull-up sub-circuit coupled to the intermediate output terminal, a final output terminal of the shift register, and the second level terminal; a first voltage stabilization sub-circuit coupled to a next-stage node connection terminal, the final output terminal, and the third node; and a pull-down transistor having a gate electrode coupled to the third node, a first electrode coupled to the first level terminal, and a second electrode coupled to the final output terminal. The driving method includes: in an input stage, providing the first level signal to the first clock terminal, providing the first level signal to the input terminal, providing the second level signal to the second clock terminal, and providing the first level signal to the third clock terminal, electrically coupling the input terminal of the shift register to the first node by the input sub-circuit, transmitting the second level signal provided through the second clock terminal to the intermediate output terminal and electrically coupling the first level terminal to the third node by the control sub-circuit, and electrically coupling the first level terminal to the final output terminal by the pull-down transistor; in an output stage, providing the second level signal to the first clock terminal, providing the first level signal to the second clock terminal, providing the second level signal to the third clock terminal, and transmitting the first level signal provided through the second clock terminal to the intermediate output terminal by the control sub-circuit, and electrically coupling the second level terminal to the final output terminal by the pull-up sub-circuit; in a reset stage, providing the second level signal to the first clock terminal, providing the second level signal to the second clock terminal, providing the first level signal to the third clock terminal, transmitting the second level signal provided through the second clock terminal to the intermediate output terminal by the first pull-up control sub-circuit, electrically coupling the first level terminal to the third node by the first pull-down control sub-circuit, electrically coupling the first level terminal to the final output terminal by the pull-down transistor, and lowering, by the first voltage stabilization sub-circuit, the potential of the third node to be lower than a voltage level of the first level signal provided through the first level terminal.

In some embodiments, the shift register further includes: a second pull-up control sub-circuit coupled to the first clock terminal, the first node, the first level terminal, and a fourth node; a third pull-up control sub-circuit coupled to the fourth node, the second level terminal, and the intermediate output terminal, and a second pull-down control sub-circuit coupled to the intermediate output terminal, the third node and a fourth clock terminal. The driving method further includes: in the output stage, transmitting the second level signal provided through the first clock terminal to the fourth node by the second pull-up control sub-circuit; and, after the reset stage; in a first pull-down stage, providing the first level signal to the first clock terminal, providing the second level signal to the second clock terminal, providing the first level signal to the third clock terminal, and electrically coupling, by the second pull-up control sub-circuit, the first level terminal to the fourth node; in a second pull-down stage, providing the second level signal to the first clock terminal, providing the first level signal to the second clock terminal, providing the second level signal to the third clock terminal, maintaining, by the third voltage stabilization sub-circuit, a potential of the fourth node to be the same as that in the first pull-down stage, and maintaining, by the second pull-down control sub-circuit, a voltage between the third node and the fourth clock terminal to be the same as that in the first pull-down stage. The first pull-down stage and the second pull-down stage occur alternately.

In another aspect, the present disclosure provides a gate driving circuit including N cascaded shift registers, each of the shift registers being any shift register described above. The intermediate output terminal of each of the 1st to (N−1)-th shift registers is coupled to the input terminal of the next-stage shift register, and the next-stage node connection terminal of each of the 1st to (N−1)-th shift registers is coupled to the first node of the next-stage shift register.

In another aspect, the present disclosure provides a display device including the gate driving circuit described above.

BRIEF DESCRIPTION OF DRAWINGS

The accompanying drawings, which constitute a part of the specification, are provided for a further understanding of the present disclosure, and for explaining the present disclosure together with the following specific implementations, but not intended to limit the present disclosure. In the drawings.

DETAILED DESCRIPTION

Specific embodiments of the present disclosure will be described below in detail in conjunction with the accompanying drawings. It should be understood that the embodiments to be described are only intended to illustrate and explain the present disclosure, but not to limit the present disclosure.

There is a certain threshold loss in an inactive signal output by the existing shift register after an output stage. For example, taking a case where the transistors in the shift register are P-type transistors and a high level signal is output in the output stage as an example, a signal of the low level signal terminal is transmitted via the pull-down transistor to the output terminal of the shift register after the output stage, but there is a threshold loss in transmitting a low level signal via the P-type transistors, resulting in a certain loss in the low level output by the shift register after the output stage.

Therefore, how to output a low level without threshold loss after the output stage becomes a technical problem to be solved urgently.

Figure 1:
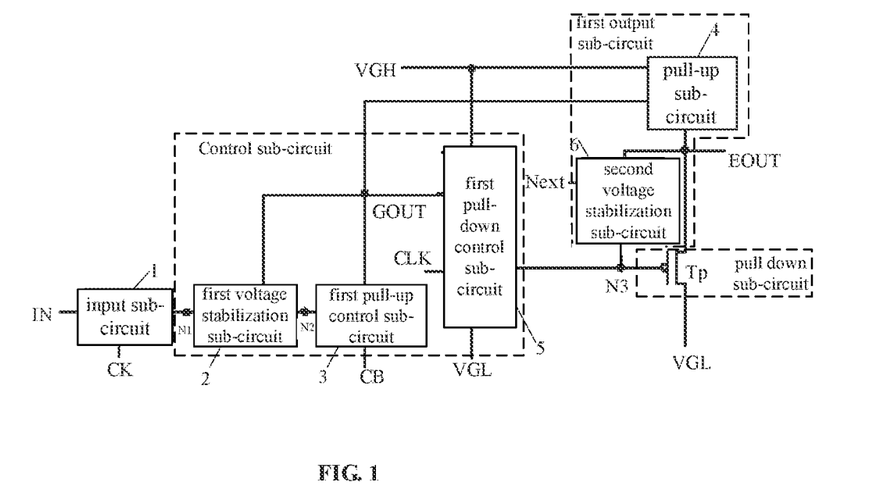
FIG. 1 is a schematic block diagram of a shift register according to an embodiment of the present disclosure.

FIG. 1 is a schematic block diagram of a shift register according to an embodiment of the present disclosure. As shown in FIG. 1, the shift register includes an input sub-circuit 1, a first voltage stabilization sub-circuit 2, a first pull-up control sub-circuit 3, a pull-up sub-circuit 4, a first pull-down control sub-circuit 5, a second voltage stabilization sub-circuit 6, and a pull-down transistor Tp. The first voltage stabilization sub-circuit 2, the first pull-up control sub-circuit 3 and the first pull-down control sub-circuit constitute a control sub-circuit, which is configured to transmit a signal provided through a second clock terminal CB to an intermediate output terminal GOUT according to a voltage level at a first node N1, and control a potential of a third node N3 according to a potential of the intermediate output terminal GOUT and a signal provided through a third clock terminal CLK in an input stage, an output stage and a reset stage.

The input sub-circuit 1 is coupled to an input terminal IN of the shift register, a first clock terminal CK, and the first node N1, and is configured to electrically couple the input terminal IN of the shift register to the first node N1 in response to a first level signal provided through the first clock terminal CK in the input stage. The first node N1 is a connection node between the input sub-circuit 1 and the first voltage stabilization sub-circuit 2.

The first voltage stabilization sub-circuit 2 is coupled to the first node N1, a second node N2, and the intermediate output terminal GOUT of the shift register, and is configured to, in the input stage, electrically couple the first node N1 to the second node N2, and stabilize a voltage between the second node N2 and the intermediate output terminal GOUT, so that a voltage between the second node N2 and the intermediate output terminal GOUT can be maintained to be the same as that in the input stage when no signal is input to the first node N1 in the output stage. The second node N2 is a connection node between the first voltage stabilization sub-circuit 2 and the first pull-up control sub-circuit 3; the intermediate output terminal GOUT is configured to be coupled to the input terminal of the next stage shift register.

The first pull-up control sub-circuit 3 is coupled to the intermediate output terminal GOUT, the second node N2 and a second clock terminal CB, and is configured to, in response to a potential of the second node N2, transmit a second level signal provided through the second clock terminal CB to the intermediate output terminal GOUT in the input stage and the reset stage, and transmit the first level signal provided through the second clock terminal CB to the intermediate output terminal GOUT in the output stage.

The pull-up sub-circuit 4 is coupled to the intermediate output terminal GOUT, a final output terminal EOUT of the shift register, and a second level terminal VGH for providing the second level signal, and configured to electrically couple the second level terminal VGH to the final output terminal EOUT in response to the potential of the intermediate output terminal GOUT in the output stage. The final output terminal EOUT is configured to be coupled to a gate line to provide a scan signal to the gate line.

The first pull-down control sub-circuit 5 is coupled to the intermediate output terminal GOUT, the third node N3, the third clock terminal CLK, the second level terminal VGH, and a first level terminal VGL for providing the first level signal, and configured to electrically couple the second level terminal VGH to the third node N3 in response to the potential of the intermediate output terminal GOUT in the output stage, and electrically couple the first level terminal VGL to the third node N3 in response to the first level signal provided through the third clock terminal CLK during the input stage and the reset stage. The third node N3 is a connection node between a gate electrode of the pull-down transistor, the second voltage stabilization sub-circuit, and a second pull-down control sub-circuit.

The second voltage stabilization sub-circuit 6 is coupled to a next-stage node connection terminal Next, the final output terminal EOUT, and the third node N3, and is configured to stabilize a voltage between the final output terminal EOUT and the third node N3 in response to the first level signal provided through the next-stage node connection terminal Next in the output stage and the reset stage, i.e., to store the voltage between the final output terminal EOUT and the third node N3 in the output stage and to maintain, in the reset stage, the stored voltage to be the same as that in the output stage. The next-stage node connection terminal Next is configured to be coupled to the first node N1 of a next-stage shift register.

A gate electrode of the pull-down transistor Tp is coupled to the third node N3, a first electrode of the pull-down transistor Tp is coupled to the first level terminal VGL, and a second electrode of the pull-down transistor Tp is coupled to the final output terminal EOUT of the shift register. The pull-down transistor Tp is turned on when the gate electrode thereof receives the first level signal.

Each of the sub-circuits may include a transistor(s), the first level signal and the second level signal may be determined according to types of the transistor(s) in each sub-circuit and the pull-down transistor Tp. In a case where each transistor is an N-type transistor, the first level signal is a high level signal, and the second level signal is a low level signal; in a case where each transistor is a P-type transistor, the first level signal is a low level signal, the second level signal is a high level signal, and accordingly, the first level terminal VGL is a low level signal terminal, and the second level terminal VGH is a high level signal terminal. The present disclosure is described by taking an example that each transistor in the shift register is a P-type transistor, the first level signal is a low level signal, the second level signal is a high level signal, and the final output terminal EOUT of the shift register outputs a high level signal in the output stage.

The reason why the shift register in the prior art outputs a low level signal with threshold loss after the output stage is that: in a reset stage after the output stage, a low level signal received by a gate electrode of the pull-down transistor is the same as a potential of a low level signal terminal coupled to a source electrode of the pull-down transistor, but a P-type transistor cannot be fully turned on unless the potential of its gate electrode is smaller than the potential of its source electrode and the potential difference is not smaller than an absolute value of a threshold voltage of the P-type transistor, so the pull-down transistor of the existing shift register cannot be fully turned on in the reset stage, thereby causing a threshold loss when a signal of the low level signal terminal is transmitted to an output terminal of the shift register. For example, the threshold voltage of the pull-down transistor is −1V, and when the potentials of the gate electrode and the source electrode of the pull-down transistor are both −7V, the pull-down transistor cannot sufficiently transmit the potential (i.e. −7V) of the source electrode to its drain electrode, and the potential of the drain electrode reaches −6V at most. Similarly, the N-type transistor also has a threshold loss when transmitting a high level signal, and thus, in the case where each transistor of the shift register is an N-type transistor and the shift register outputs a low level signal in the output stage, there is also a threshold loss in the high level signal output by the shift register in the reset stage.

Compared with the prior art, the operation process of the shift register in the present disclosure is as follows. In an input stage, a first level signal (e.g., a low level signal) of the input terminal IN is transmitted to the second node N2 through the input sub-circuit 1 and the first voltage stabilization sub-circuit 2, the first pull-up control sub-circuit 3 transmits a second level signal (e.g., a high level signal) provided through the second clock terminal CB to the intermediate output terminal GOUT, the first pull-down control sub-circuit 5 transmits the first level signal of the first level terminal VGL to the third node N3 under the control of the first level signal of the third clock terminal CLK, so that the pull-down transistor Tp is turned on, and the final output terminal EOUT receives the low level signal of the first level terminal VGL. In the output stage, under the voltage stabilizing effect of the first voltage stabilization sub-circuit 2, the potential of the second node N2 is maintained at a low level, so that the first pull-up control sub-circuit 3 transmits the low level signal of the second clock terminal CB to the intermediate output terminal GOUT, and further under the control of the low potential of the intermediate output terminal GOUT, the first pull-down control sub-circuit 5 transmits the second level signal (high level signal) of the second level terminal VGH to the third node N3; at this time, the pull-up sub-circuit 4 transmits the high level signal of the second level terminal VGH to the final output terminal EOUT. In the reset stage, under the control of the low level signal provided through the third clock terminal CLK, the first pull-down control sub-circuit 5 transmits the low level signal of the first level terminal VGL to the third node N3, so that the pull-down transistor Tp is turned on, and the final output terminal EOUT receives the low level signal of the first level terminal VGL; at this time, since the potential of the final output terminal EOUT is lowered compared to that in the output stage, under the voltage stabilizing effect of the second voltage stabilization sub-circuit 6, the potential of the third node N3 is further lowered from the low potential at the beginning of the reset stage, so as to ensure that the pull-down transistor Tp can be fully turned on, and thus the final output terminal EOUT can output a low level signal without threshold loss.

For example, the first level signal is a signal of −7V the second level signal is a signal of +7V, and the threshold voltage of the pull-down transistor Tp is −1V. In this case, for the shift register of the present disclosure, in the input stage, a signal of −7V provided through the input terminal IN is transmitted to the second node N2 through the input sub-circuit 1 and the first voltage stabilization sub-circuit 2; at this time, in a case where the input sub-circuit 1 includes a transistor having a threshold voltage of −1V, the potential of the second node N2 reaches −7+|−1|=−6V. In the output stage, a signal of −7V at the second clock terminal is transmitted to the intermediate output terminal GOUT through the first pull-up control sub-circuit 3, and at this time, under the voltage stabilizing effect of the first voltage stabilization sub-circuit 2, the potential of the second node N2 reaches −6−(7+7)=−20V, so that the first pull-down control sub-circuit 5 couples the second level terminal VGH to the third node N3, and the potential of the third node N3 reaches +7V; in addition, under the control of the potential of the intermediate output terminal GOUT, the pull-up sub-circuit 4 couples the second level terminal VGH and the final output terminal EOUT, and the potential of the final output terminal EOUT reaches +7V, so that the voltage between the final output terminal EOUT and the third node N3 is 0V. In the reset stage, the first pull-down control sub-circuit 5 transmits a signal of −7V at the first level terminal VGL to the third node N3, so that the pull-down transistor Tp is turned on, and the potential of the final output terminal EOUT reaches −6V at first; since the potential of the final output terminal is lowered from the previous +7V to −6V, under the voltage stabilizing effect of the second voltage stabilization sub-circuit 6, the potential of the third node N3 is further lowered to −7−(7+6)=−20V from the previous −7V, so as to ensure that the pull-down transistor Tp can be fully turned on to sufficiently transmit the voltage of −7V of the first signal terminal VGL to the final output terminal EOUT.

Figure 2:
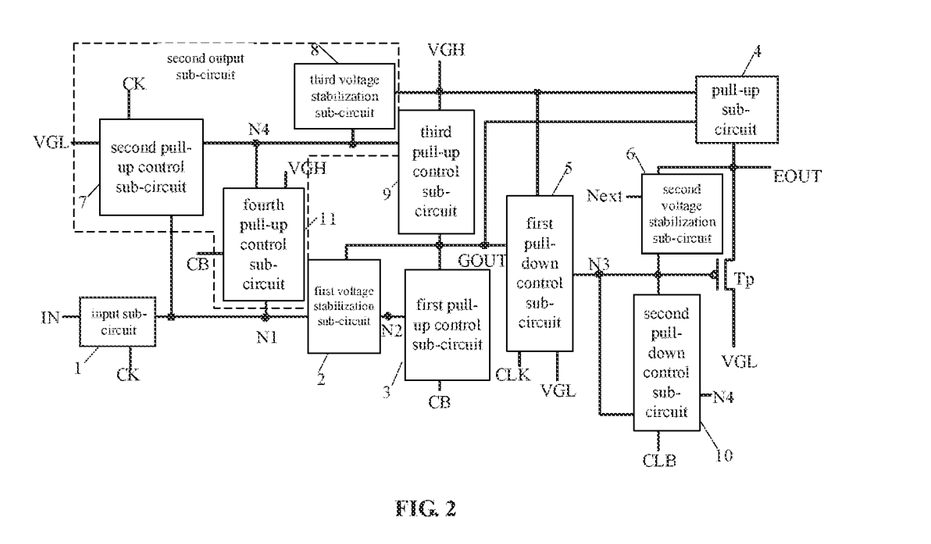
FIG. 2 is a schematic block diagram of a shift register according to an embodiment of the present disclosure.

FIG. 2 is a schematic block diagram of a shift register according to an embodiment of the present disclosure. As shown in FIG. 2, compared with the shift register described with reference to FIG. 1, the shift register further includes a second pull-up control sub-circuit 7, a third voltage stabilization sub-circuit 8, a third pull-up control sub-circuit 9, and a second pull-down control sub-circuit 10.

The second pull-up control sub-circuit 7 is coupled to the first clock terminal CK, the first node N1, the first level terminal VGL and a fourth node N4, and is configured to transmit the second level signal provided through the first clock terminal CK to the fourth node N4 in response to the potential of the first node N1 during the output stage, and couple the first level terminal VGL to the fourth node N4 in response to the first level signal of the first clock terminal CK in a first pull-down stage.

The third voltage stabilization sub-circuit 8 is coupled to the second level terminal VGH and the fourth node N4, and is configured to stabilize a voltage between the second level terminal VGH and the fourth node N4. The fourth node N4 is a connection node between the second pull-up control sub-circuit 7 and the third voltage stabilization sub-circuit 8.

The third pull-up control sub-circuit 9 is coupled to the fourth node N4, the second level terminal VGH and the intermediate output terminal GOUT, and is configured to couple the second level terminal VGH to the intermediate output terminal GOUT in response to a potential of the fourth node N4 during the first pull-down stage and a second pull-down stage.

The second pull-down control sub-circuit 10 is coupled to the intermediate output terminal GOUT, the third node N3 and a fourth clock terminal CLB, and is configured to, in response to the potentials of the fourth node N4 and the intermediate output terminal GOUT, store a voltage between the third node N3 and the fourth clock terminal CLB in the first pull-down stage, and stabilize the voltage between the third node N3 and the fourth clock terminal CLB when the signal provided through the fourth clock terminal CLB transits from the second level signal in the first pull-down stage to the first level signal in the second pull-down stage.

The operation of the shift register of FIG. 2 will be described by taking a case where the first level signal is at a low level and the second level signal is at a high level as an example. In the output stage, the potential of the first node N1 reaches a low level (see the above description), and the second pull-up control sub-circuit 7 transmits the high level signal provided through the first clock terminal CK to the fourth node N4 under the control of the low potential of the first node N1; at this time, the third pull-up control sub-circuit 9 does not electrically couple the second level terminal VGH to the intermediate output terminal GOUT, thereby ensuring a low potential of the intermediate output terminal GOUT in the output stage. In the first pull-down stage after the reset stage, the second pull-up control sub-circuit 7 transmits a low level signal of the first level terminal VGL to the fourth node N4, and at this time, the third pull-up control sub-circuit 9 transmits a high level signal of the second level terminal VGH to the intermediate output terminal GOUT, thereby preventing the final output terminal EOUT from being electrically coupled to the second level terminal VGH through the pull-up sub-circuit 4; in addition, the potential of the third node N3 is maintained to be the low potential in the previous stage under the voltage stabilizing effect of the second voltage stabilization sub-circuit 6, and the second pull-down control sub-circuit 10 stabilizes the voltage between the fourth clock terminal CLB and the third node N3 to be the current value under the common control of the low potential of the third node N3 and the low potential of the fourth node N4. In the second pull-down stage, the potential of the third node N3 is maintained to be the low potential in the first pull-down stage at first, and the potential of the fourth node N4 is maintained to be the low potential under the voltage stabilizing effect of the third voltage stabilization sub-circuit 8; under the control of the low potentials of the third node N3 and the fourth node N4, the second pull-down control sub-circuit 10 stabilizes the voltage between the fourth clock terminal CLB and the third node N3 to be the same as that in the first pull-down stage; since the signal provided through the fourth clock terminal CLB transits from the high level in the first pull-down stage to the low level in the second pull-down stage, the potential of the third node N3 is lowered again accordingly. The first pull-down stage and the second pull-down stage may occur alternately, so as to periodically pull down the third node N3 to a lower potential, to prevent the potential of the third node N3 from rising due to leakage of the transistor, and therefore, the shift register of FIG. 2 can make the third node N3 always at a lower potential than the first level terminal VGL after the reset stage, so as to ensure that the pull-down transistor Tp is fully turned on, and a low level signal is output through the final output terminal EOUT without threshold loss. Compared to the shift register of FIG. 1, the shift register of FIG. 2 can maintain the potential of the third node N3 to be the same as or lower than that in the reset stage, so as to prevent a phenomenon that the pull-down transistor Tp cannot be fully turned on due to leakage at the third node N3.

In the shift register of FIG. 2, by taking the above-mentioned case where the first level signal is a signal of −7V, the second level signal is a signal of +7V, and the threshold voltage of the pull-down transistor Tp is −1V as an example again, in the input stage, the potential of the second node N2 reaches −7+|−1|=−6V as in FIG. 1. In the output stage, as in FIG. 1, the potential of the second node N2 reaches −20V, the potential N3 of the third node reaches +7V, and the potential of the final output terminal EOUT reaches +7V. In the reset stage, the potential of the third node N3 is further lowered to −20V from −7V, thereby ensuring that the pull-down transistor Tp can be fully turned on. In the first pull-down stage, the second pull-up control sub-circuit 7 transmits a signal of −7V from the first level terminal VGL to the fourth node N4, and at this time, the intermediate output terminal GOUT receives, through the third pull-up control sub-circuit 9, a signal of +7V provided through the second level terminal VGH; in addition, the potential of the third node N3 is maintained to be the potential of −20V in the previous stage under the voltage stabilizing effect of the second voltage stabilization sub-circuit 6; and the second pull-down control sub-circuit 10 stabilizes the voltage between the fourth clock terminal CLB and the third node N3 to be the current value under the common control of the low potentials of the third node N3 and the fourth node N4. In the second pull-down stage, the voltage of the signal provided through the fourth clock terminal CLB transits from +7V in the first pull-down stage to −7V in the second pull-down stage, so that the potential of the third node N3 is further lowered to reach −20−(7+7)=−27V.

In some embodiments, the shift register further includes a fourth pull-up control sub-circuit 11, the fourth pull-up control sub-circuit 11 is coupled to the fourth node N4, the second clock terminal CB, the first node N1, and the second level terminal VGH, and is configured to electrically couple the second level terminal VGH to the first node N1 in response to the potential of the fourth node N4 and the first level signal provided through the second clock terminal CB during the second pull-down stage. The fourth pull-up control sub-circuit 11 can ensure that the potentials of the first node N1 and the second node N2 are at a high level in the second pull-down stage, thereby ensuring that the second clock terminal CB is disconnected from the intermediate output terminal GOUT, and preventing the intermediate output terminal GOUT from being influenced by a low level signal of the second clock terminal CB.

Figure 3:
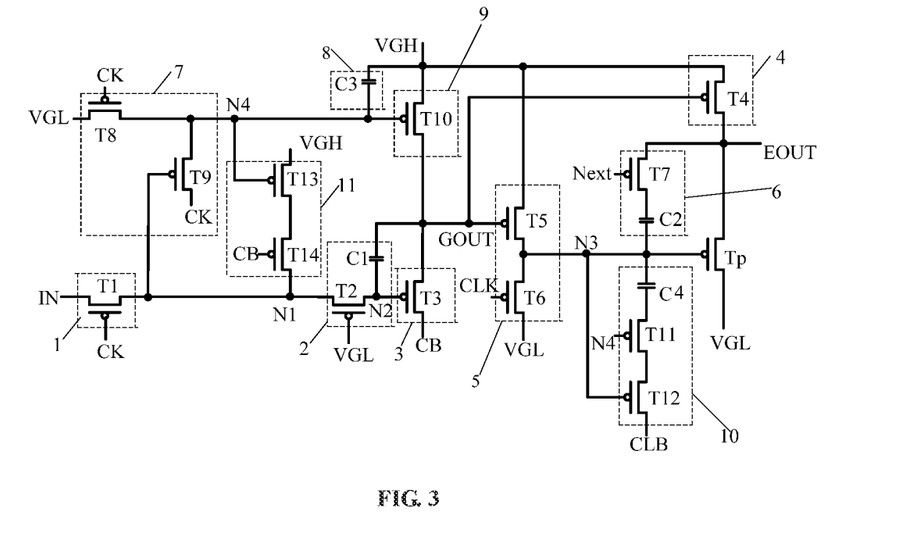
FIG. 3 is a circuit schematic diagram of a shift register according to an embodiment of the present disclosure.

FIG. 3 is a circuit schematic diagram of a shift register according to an embodiment of the present disclosure, which illustrates a specific implementation of the shift register of FIG. 2. The structure of the shift register according to the embodiment of the present disclosure is described below with reference to FIG. 3.

The input sub-circuit 1 includes a first transistor T1, a gate electrode of the first transistor T1 is coupled to the first clock terminal CK, a first electrode of the first transistor T1 is coupled to the input terminal IN of the shift register, and a second electrode of the first transistor T1 is coupled to the first node N1.

The first voltage stabilization sub-circuit 2 includes a first capacitor C1 and a second transistor T2. A first terminal of the first capacitor C1 is coupled to the second node N2, and a second terminal of the first capacitor C1 is coupled to the intermediate output terminal GOUT. A gate electrode of the second transistor T2 is coupled to the first level terminal VGL, a first electrode of the second transistor T2 is coupled to the second node N2, and a second electrode of the second transistor T2 is coupled to the first node N1.

The first pull-up control sub-circuit 3 includes a third transistor T3, a gate electrode of the third transistor T3 is coupled to the second node N2, a first electrode of the third transistor T3 is coupled to the intermediate output terminal GOUT, and a second electrode of the third transistor T3 is coupled to the second clock terminal CB.

The pull-up sub-circuit 4 includes a fourth transistor T4, a gate electrode of the fourth transistor T4 is coupled to the intermediate output terminal GOUT, a first electrode of the fourth transistor T4 is coupled to the second level terminal VGH, and a second electrode of the fourth transistor T4 is coupled to the final output terminal EOUT.

The first pull-down control sub-circuit 5 includes a fifth transistor T5 and a sixth transistor T6. A gate electrode of the fifth transistor T5 is coupled to the intermediate output terminal GOUT, a first electrode of the fifth transistor T5 is coupled to the second level terminal VGH, and a second electrode of the fifth transistor T5 is coupled to the third node N3. A gate electrode of the sixth transistor T6 is coupled to the third clock terminal CLK, a first electrode of the sixth transistor T6 is coupled to the third node N3, and a second electrode of the sixth transistor T6 is coupled to the first level terminal VGL.

The second voltage stabilization sub-circuit 6 includes a second capacitor C2 and a seventh transistor T7. A gate electrode of the seventh transistor T7 is coupled to the next-stage node connection terminal Next, a first electrode of the seventh transistor T7 is coupled to the final output terminal EOUT, a second electrode of the seventh transistor T7 is coupled to a first terminal of the second capacitor C2, and a second terminal of the second capacitor C2 is coupled to the third node N3.

The second pull-up control sub-circuit 7 includes an eighth transistor T8 and a ninth transistor T9. A gate electrode of the eighth transistor T8 is coupled to the first clock terminal CK, a first electrode of the eighth transistor T8 is coupled to the first level terminal VGL, and a second electrode of the eighth transistor T8 is coupled to the fourth node N4. A gate electrode of the ninth transistor T9 is coupled to the first node N1, a first electrode of the ninth transistor T9 is coupled to the fourth node N4, and a second electrode of the ninth transistor T9 is coupled to the first clock terminal CK.

The third voltage stabilization sub-circuit 8 includes a third capacitor C3, a first terminal of the third capacitor C3 is coupled to the fourth node N4, and a second terminal of the third capacitor C3 is coupled to the second level terminal VGH.

The third pull-up control sub-circuit 9 includes a tenth transistor T10, a gate electrode of the tenth transistor T10 is coupled to the fourth node N4, a first electrode of the tenth transistor T10 is coupled to the second level terminal VGH, and a second electrode of the tenth transistor T10 is coupled to the intermediate output terminal GOUT.

The second pull-down control sub-circuit 10 includes an eleventh transistor T1, a twelfth transistor T12, and a fourth capacitor C4. A gate electrode of the eleventh transistor T11 is coupled to the fourth node N4, a first electrode of the eleventh transistor T11 is coupled to a first terminal of the fourth capacitor C4, and a second electrode of the eleventh transistor T11 is coupled to a first electrode of the twelfth transistor T12. A gate electrode of the twelfth transistor T12 and a second terminal of the fourth capacitor C4 are both coupled to the third node N3, and a second electrode of the twelfth transistor T12 is coupled to the fourth clock terminal CLB.

The fourth pull-up control sub-circuit 11 includes a thirteenth transistor T13 and a fourteenth transistor T14. A gate electrode of the thirteenth transistor T13 is coupled to the fourth node N4, a first electrode of the thirteenth transistor T13 is coupled to the second level terminal VGH, and a second electrode of the thirteenth transistor T13 is coupled to a first electrode of the fourteenth transistor T14. A gate electrode of the fourteenth transistor T14 is coupled to the second clock terminal CB, and a second electrode of the fourteenth transistor is coupled to the first node N1.

In the present embodiment, a "first electrode" specifically refers to a source electrode of a transistor, and a "second electrode" specifically refers to a drain electrode of the transistor. It should be noted that the "first electrode" and the "second electrode" may be interchanged. In addition, in some embodiments, each transistor in the shift register of the present disclosure is a P-type transistor.

Figure 4:
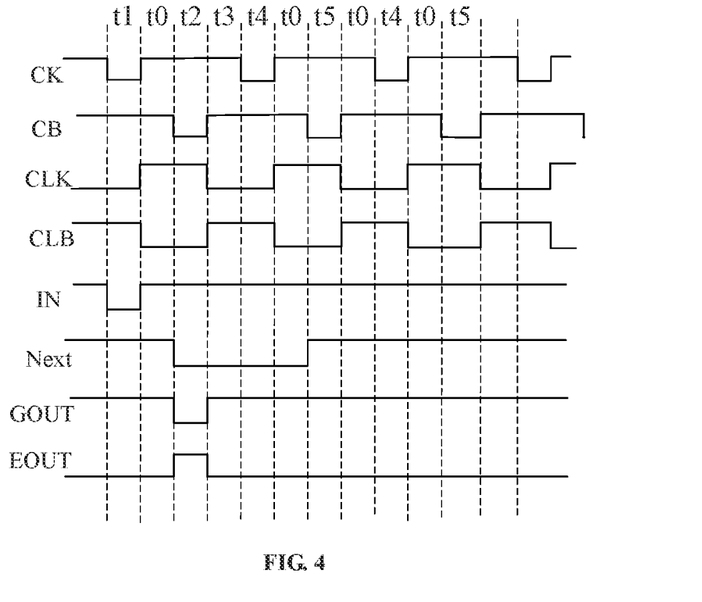
FIG. 4 is a timing diagram illustrating operation of a shift register according to an embodiment of the present disclosure.

The operation process of the shift register in the present embodiment will be described below with reference to FIGS. 3 and 4. As an example, each transistor is a P-type transistor, the first level terminal VGL provides a low level signal, the second level terminal VGH provides a high level signal, a voltage of the low level signal is VL, and a voltage of the high level signal is VH. FIG. 4 is an operational timing diagram of a shift register according to the present disclosure. As shown in FIG. 4, an operation process of the shift register includes an input stage t1, an output stage t2, a reset stage t3, a first pull-down stage t4 and a second pull-down stage t5, and the first pull-down stage t4 and the second pull-down stage t5 occur alternately after the reset stage t3.

During the input stage t1, the input terminal IN of the shift register receives a low level signal, a low level signal is provided through the first clock terminal CK, a high level signal is provided through the second clock terminal CB, a low level signal is provided through the third clock terminal CLK, and a high level signal is provided through the fourth clock terminal CLB.

The first transistor T1 is turned on under the control of a low level signal provided through the first clock terminal CK; the second transistor T2 is turned on under the control of a low level signal provided through the first level terminal VGL, and the input terminal IN is electrically coupled to the first node N1 and the second node N2. Since the P-type transistor is fully turned on only when the potential of its gate electrode is less than the potential of its source electrode and the potential difference is no less than the threshold voltage of the transistor (i.e., the P-type transistor has a threshold loss when transmitting a low level signal), the potential of the first node N1 is VL+|Vth|, where VL is a voltage of the low level signal provided through the input terminal IN, and |Vth| is an absolute value of the threshold voltage of the first transistor T1. Since the potential of the first level terminal VGL is lower than the potential of the first node N1 the second transistor 2 is fully turned on, and the potential of the second node N2 reaches VL+|Vth|, so that the third transistor T3 is turned on, and the intermediate output terminal GOUT receives the high level signal provided through the second clock terminal CB.

Since the potential of the intermediate output terminal GOUT reaches a high level, the fifth transistor T5 is turned off; the sixth transistor T6 is turned on under the control of the low level signal provided through the third clock terminal CLK, so that the low level signal of the first level terminal VGL is transmitted to the third node N3, and thus the pull-down transistor Tp is controlled to be turned on, and the final output terminal EOUT receives the low level signal of the first level terminal VGL.

Here, in the first display period, the third node N3 receives a low level signal of the first level terminal VGL via the sixth transistor T6 in the input stage, and after the first display period, the potential of the third node N3 is maintained in the input stage to be a potential at the end of the previous display period (the potential is lower than the low level of the first level terminal VGL, see the following description in detail).

In the output stage t2, the input terminal IN of the shift register receives a high level signal, high level signals are provided through the first clock terminal CK and the third clock terminal CLK, respectively, and low level signals are provided through the second clock terminal CB and the fourth clock terminal CLB, respectively; a low level signal is provided through the next-stage node connection terminal Next.

At this time, the first transistor T1 is turned off, and a low level signal of the second clock terminal CB is transmitted to the intermediate output terminal GOUT via the third transistor T3. Since the potential of the intermediate output terminal GOUT is lowered compared to that in the input stage t1, under the bootstrapping effect of the capacitor C1, the potential of the second node N2 is further lowered to reach 2VL+|Vth|−VH, so that the third transistor T3 is turned on more sufficiently. In addition, since the potential of the gate electrode of the second transistor T2 is higher than the potential of the second node N2 at this time, the second transistor T2 is turned off, thereby preventing the first node N1 from leaking electricity.

The sixth transistor T6 is turned off under the control of the high level signal of the third clock terminal CLK. Since the intermediate output terminal GOUT reaches the low level, the fourth transistor T4 and the fifth transistor T5 are both turned on, and the third node N3 and the final output terminal EOUT receive the high level signal of the second level terminal VGH. Meanwhile, the seventh transistor T7 is turned on under the control of a low level signal provided through the next-stage node connection terminal Next, and potentials at both terminals of the second capacitor C2 are the same as the potential of the final output terminal EOUT and the potential of the third node N3, respectively.

In addition, since both the first transistor T1 and the second transistor T2 are turned off, the potential of the first node N1 is maintained to be the low potential in the previous stage, so that the ninth transistor T9 is turned on, and thus a high level signal of the first clock terminal CK is transmitted to the fourth node N4. Under the control of the high potential of the fourth node N4, both the tenth transistor T10 and the eleventh transistor T11 are turned off to prevent the high level signal of the second signal terminal VGH from affecting the potential of the intermediate output terminal GOUT and to prevent the fourth clock terminal CLKB from affecting the potential of the third node N3.

In the reset stage t3, the input terminal IN of the shift register receives a high level signal, high level signals are provided through the first clock terminal CK, the second clock terminal CB, and the fourth clock terminal CLKB, respectively, and a low level signal is provided through the third clock terminal CLK; a low level signal is provided through the next-stage node connection terminal.

Like in the output stage t2, the first transistor T1 and the second transistor T2 are both turned off, and the third transistor T3 is turned on. At this time, the high level signal of the second clock terminal CB is transmitted to the intermediate output terminal GOUT. Under the control of the high potential of the intermediate output terminal GOUT, both the fourth transistor T4 and the fifth transistor T5 are turned off. Meanwhile, the sixth transistor T6 is turned on under the control of the high level signal provided through the third clock terminal CLK, so that the third node N3 is electrically coupled to the first level terminal VGL such that the potential of the third node N3 reaches a low level.

Under the control of the low potential of the third node N3, the pull-down transistor Tp is turned on to electrically couple the final output terminal EOUT to the first level terminal VGL, thereby causing the potential of the final output terminal EOUT to be lowered compared to that in the output stage t2. Meanwhile, the seventh transistor T7 is turned on under the control of the low level signal provided through the next-stage node connection terminal, so that the potential of the first terminal of the second capacitor C2 is lowered compared to that in the output stage t2, and therefore, under the bootstrapping effect of the second capacitor C2, the potential of the third node N3 (i.e., the second terminal of the second capacitor C2) is further lowered to be lower than VL, so as to ensure that the pull-down transistor Tp is turned on more sufficiently, and thus the final output terminal EOUT outputs a low level signal without threshold loss.

In the first pull-down stage t4, the input terminal IN of the shift register receives a high level signal, low level signals are provided through the first clock terminal CK and the third clock terminal CLK, respectively, and high level signals are provided through the second clock terminal CB and the fourth clock terminal CLB, respectively; a low level signal is provided through the next-stage node connection terminal Next.

Since a low level signal is provided through the first clock terminal CK, the first transistor T1 is turned on to transmit the high level signal of the input terminal IN to the first node N1; and the second transistor T2 is turned on under the control of the first signal terminal VGL, so that the second node N2 receives the high level signal of the input terminal IN and thus the third transistor T3 is turned off. Meanwhile, the eighth transistor T8 is turned on under the control of the low level signal provided through the first clock terminal CK, thereby transmitting the low level signal of the first level terminal VGL to the fourth node N4.

Under the control of the low potential of the fourth node N4, the tenth transistor T10 is turned on to transmit the high level signal of the second level terminal VGH to the intermediate output terminal GOUT, so that both the fourth transistor T4 and the fifth transistor T5 are turned off. In addition, the seventh transistor T7 is kept on under the control of the low level signal provided through the next-stage node connection terminal Next, and the second capacitor C2 keeps the third node N3 at a low potential in the reset stage t3, so that the twelfth transistor T12 is turned on. Also, since the fourth node N4 is at a low potential, the eleventh transistor T11 is turned on, and at this time, the fourth capacitor C4 stores a potential difference between the third node N3 and the high level signal provided through the fourth clock terminal CLB.

In the second pull-down stage t5, the input terminal IN of the shift register receives a high level signal, high level signals are provided through the first clock terminal CK and the third clock terminal CLK, respectively, and low level signals are provided through the second clock terminal CB and the fourth clock terminal CLB, respectively; a high level signal is provided through the next-stage node connection terminal Next.

Since a high level signal is provided through the first clock terminal CK, both the eighth transistor T8 and the first transistor T1 are turned off; under the voltage stabilizing effect of the first capacitor CL the potential of the first node N1 is maintained to be the high potential in the previous first pull-down stage t4, so that the ninth transistor T9 is also turned off; under the voltage stabilizing effect of the third capacitor C3, the potential of the fourth node N4 is maintained to be the low potential in the first pull-down stage t4. In addition, under the voltage stabilizing effect of the fourth capacitor C4, the potential of the third node N3 is maintained to be the low potential in the first pull-down stage t4 at first.

Since the potentials of the third node N3 and the fourth node N4 are low, the eleventh transistor T11 and the twelfth transistor T12 are both turned on, and the first terminal of the fourth capacitor C4 receives a low level signal of the fourth clock terminal CLB. Since the potential of the first terminal of the fourth capacitor C4 is lowered compared to that in the first pull-down stage, the potential of the second terminal (i.e., the third node N3) of the fourth capacitor C4 is also lowered accordingly to reach a level lower than the low potential in the first pull-down stage t4, so as to ensure that the pull-down transistor Tp is fully turned on, and thus the final output terminal EOUT outputs a low level signal without threshold loss.

In addition, in practical applications, it is inevitable that there is parasitic capacitance in a transistor, which easily causes a potential of a gate electrode of the transistor to fluctuate when a signal transition occurs at a clock terminal coupled to a source electrode or a drain electrode of the transistor, thereby affecting the turn-on degree of the transistor. In the shift register according to the present embodiment, in the second pull-down stage t5, the thirteenth transistor T13 is turned on under the control of the low potential of the fourth node N4, and the fourteenth transistor T14 is turned on under the control of the low level signal provided through the second clock terminal CB, so that the high level signal of the second level terminal VGH is transmitted to the first node N1, and further transmitted to the second node N2 via the second transistor T2, thereby stabilizing the potential of the second node N2 to ensure that the third transistor T3 is in an off state.

In this embodiment, the first pull-down stage t4 and the second pull-down stage t5 may alternate after the reset stage t3, until the input terminal IN of the shift register receives a low level signal again and the next period starts. By further pulling down the potential of the third node N3 in the second pull-down stage t5 from that in the first pull-down stage t4, a situation in which the potential of the third node N3 rises due to leakage of a transistor can be prevented, thereby ensuring that the pull-down transistor Tp is fully turned on.

In the timing sequence of FIG. 4, there are interval stages t0 between the output stage t2 and the input stage t1, between the second pull-down stage t5 and the first pull-down stage t4 before the second pull-down stage t5, and between the second pull-down stage t5 and the first pull-down stage t4 after the second pull-down stage t5. In each interval stage t0, high level signals are provided through the first clock terminal CK and the second clock terminal CB, respectively; the signals provided through the third clock terminal CLK and the fourth clock terminal CLB in each interval stage t0 are respectively the same as the signals provided through the third clock terminal CLK and the fourth clock terminal CLB in a next stage after the interval stage to. The function of the interval stage t0 will be explained in conjunction with the following gate driving circuit, and will not be described here.

Figure 5:
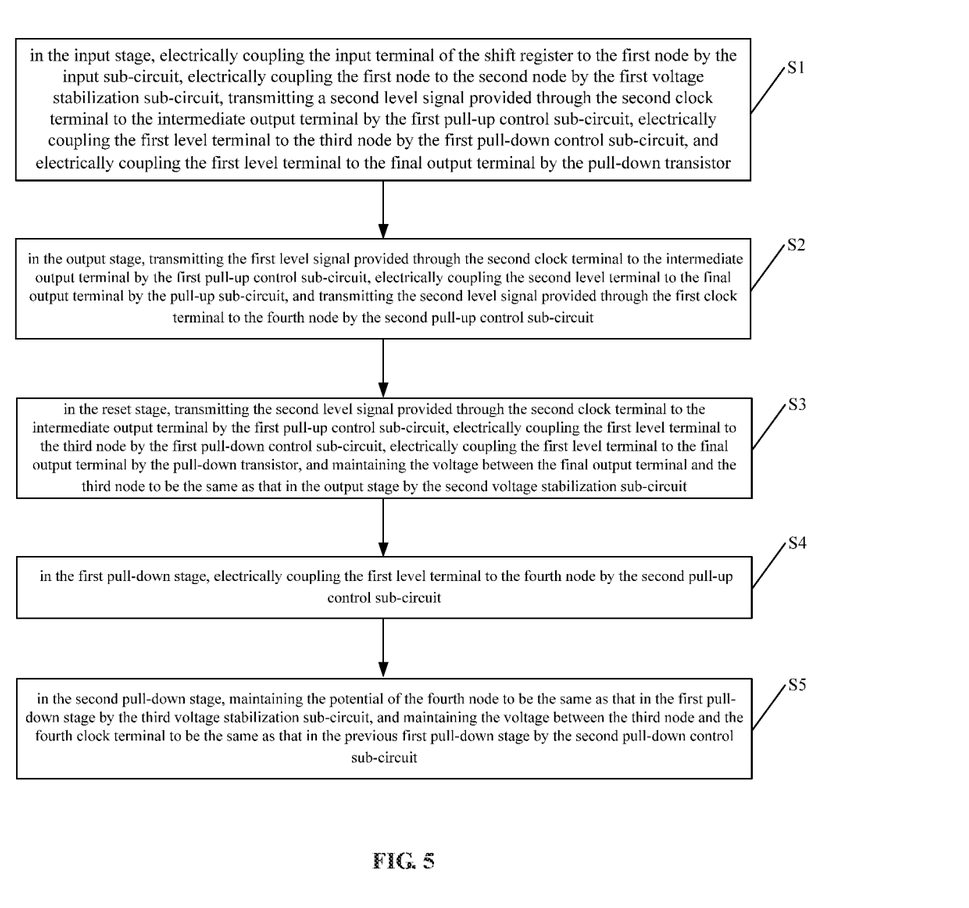
FIG. 5 is a flowchart of a driving method of a shift register according to an embodiment of the present disclosure.

FIG. 5 is a flowchart of a driving method of a shift register according to an embodiment of the present disclosure, the shift register being the shift register described above. As shown in FIG. 5, the driving method includes steps S1-S3.

In step S1, in the input stage, the input sub-circuit electrically couples the input terminal of the shift register to the first node, the first voltage stabilization sub-circuit electrically couples the first node to the second node, and the first pull-up control sub-circuit transmits a second level signal provided through the second clock terminal to the intermediate output terminal, the first pull-down control sub-circuit electrically couples the first level terminal to the third node, and the pull-down transistor electrically couples the first level terminal to the final output terminal.

In step S2, in the output stage, the first pull-up control sub-circuit transmits the first level signal provided through the second clock terminal to the intermediate output terminal, and the pull-up sub-circuit electrically couples the second level terminal to the final output terminal.

In step S3, in the reset stage, the first pull-up control sub-circuit transmits the second level signal provided through the second clock terminal to the intermediate output terminal, the first pull-down control sub-circuit electrically couples the first level terminal to the third node, the pull-down transistor electrically couples the first level terminal to the final output terminal, and the second voltage stabilization sub-circuit maintains the voltage between the final output terminal and the third node to be the same as that in the output stage.

In a case where the shift register further includes a second pull-up control sub-circuit, a third voltage stabilization sub-circuit, a third pull-up control sub-circuit, and a second pull-down control sub-circuit, in the output stage of step S2, the second pull-up control sub-circuit transmits the second level signal provided through the first clock terminal to the fourth node. The driving method further includes steps S4 and S5 performed after the reset stage.

In step S4, the second pull-up control sub-circuit electrically couples the first level terminal to the fourth node in the first pull-down stage.

In step S5, in the second pull-down stage, the third voltage stabilization sub-circuit maintains the potential of the fourth node to be the same as that in the first pull-down stage, the second pull-down control sub-circuit maintains the voltage between the third node and the fourth clock terminal to be the same as that in the previous first pull-down stage.

The first pull-down stage and the second pull-down stage occur alternately until a next period.

In addition, when the shift register further includes a fourth pull-up control sub-circuit, the fourth pull-up control sub-circuit electrically couples the second level terminal to the first node in the second pull-down stage, so as to ensure that the potential of the first node is at a high level.

The detailed operation processes of the above steps have already been described in the above description with reference to FIGS. 1 to 3, and will not be described again here.

Figure 6:
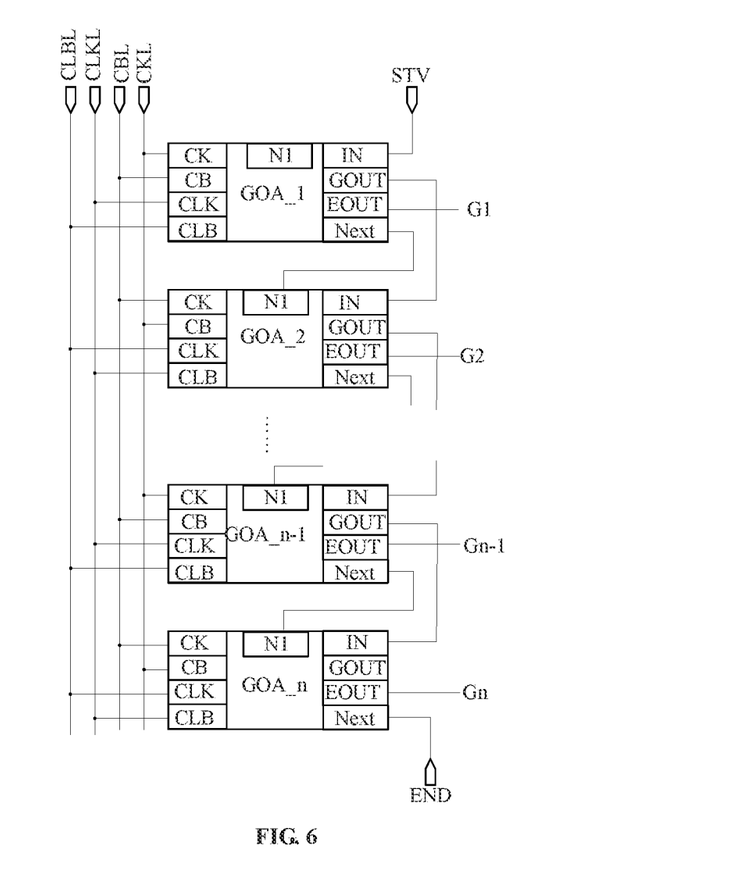
FIG. 6 is a schematic block diagram of a gate driving circuit according an embodiment of the present disclosure.

FIG. 6 is a schematic structural diagram of a gate driving circuit according to an embodiment of the present disclosure, and as shown in FIG. 6, the gate driving circuit includes n cascaded shift registers GOA_1, GOA_2, ..., GOA_n−1 and GOA_n, the shift registers each being any shift register described above.

The final output terminals EOUT of the stages of shift registers are coupled to gate lines G1, G2, ..., Gn in one-to-one correspondence. The intermediate output terminal GOUT of each of the shift registers GOA_1 to GOA_n−1 except for the last-stage shift register GOA_n is coupled to the input terminal IN of the next-stage shift register. In addition, the next-stage node connection terminal Next of each of the shift registers GOA_1 to GOA_n−1 except for the last-stage shift register GOA_n is coupled to the first node N of the next-stage shift register, thereby realizing a low level output of the previous-stage shift register without threshold loss by using signals in a next stage and a previous stage without an additional power signal.

In addition, an input terminal IN of the first-stage shift register GOA_1 is coupled to a frame start terminal STV, the next-stage node connection terminal Next of the last-stage shift register GOA_n is coupled to a signal terminal END, and the signal terminal END is configured to provide a low level signal in an output stage, a reset stage, and a first pull-down stage of the last-stage shift register GOA_n.

In addition, the gate driving circuit may further include a first clock signal line CKL, a second clock signal line CBL, a third clock signal line CLKL, and a fourth clock signal line CLBL, all of which are used to provide clock signals. The first clock terminals CK of the odd-stage shift registers and the second clock terminals CB of the even-stage shift registers are coupled to the first clock signal line CKL, the second clock terminals CB of the odd-stage shift registers and the first clock terminals CK of the even-stage shift registers are coupled to the second clock signal line CBL, the third clock terminals CLK of the odd-stage shift registers and the fourth clock terminals CLB of the even-stage shift registers are coupled to the third clock signal line CLKL, and the fourth clock terminals CLB of the odd-stage shift registers and the third clock terminals CLK of the even-stage shift registers are coupled to the fourth clock signal line CLBL.

Since the final output terminal of the shift register outputs a low level signal only when a low level signal is provided through the second clock terminal CB of the shift register, when one of the first clock signal line CKL and the second clock signal line CBL provides a high level signal, a high level signal is output through the final output terminal of one stage of shift register. For example, if the final output terminal of the first-stage shift register outputs a high level signal in Stage t2 in FIG. 4, then a high level signal is output through the final output terminal of the second-stage shift register in Stage t4, a high level signal is output through the final output terminal of the third-stage shift register in a second Stage t4, and so on. In FIG. 4, the interval stage t0 is provided to make the output stages of respective stages of shift registers evenly distributed. It should be noted that, duty ratios of the clock signals provided through the clock signal lines CKL, CBL, CLKL, and CLBL are not limited in the present disclosure as long as the intervals between the output stages of respective stages of shift registers are the same.

The gate driving circuit according to the embodiments of the present disclosure can output a low level signal without threshold loss by using signals of the next-stage shift register and the previous-stage shift register, and has a simple structure.

The embodiments of the present disclosure provide a display device including the gate driving circuit described above.

It can be understood that the foregoing embodiments are merely exemplary embodiments used for describing the principle of the present disclosure, but the present disclosure is not limited thereto. Those of ordinary skill in the art may make various variations and improvements without departing from the spirit and essence of the present disclosure, and these variations and improvements shall also fall into the protection scope of the present disclosure.

What is claimed is:

1. A shift register, comprising:
   an input sub-circuit coupled to an input terminal of the shift register, a first clock terminal and a first node, and configured to electrically couple the input terminal to the first node in response to a first level signal provided through the first clock terminal;
   a control sub-circuit coupled to the first node, an intermediate output terminal of the shift register, a second clock terminal, a third node, a third clock terminal, a first level terminal for providing the first level signal, and a second level terminal for providing a second level signal, and configured to transmit a signal provided through the second clock terminal to the intermediate output terminal according to a voltage level at the first node, and control a potential of the third node according to a potential of the intermediate output terminal and a signal provided through the third clock terminal;

a first output sub-circuit coupled to the intermediate output terminal, a final output terminal of the shift register, the second level terminal, a next-stage node connection terminal, and the third node, and configured to electrically couple the second level terminal to the final output terminal in response to the potential of the intermediate output terminal, and stabilize a voltage between the final output terminal and the third node in response to the first level signal provided through the next-stage node connection terminal; and a pull-down sub-circuit coupled to the third node, the first level terminal, and the final output terminal.

2. The shift register of claim 1, further comprising: a second output sub-circuit, coupled to the first clock terminal, the first node, the first level terminal, a fourth node, the second level terminal, the intermediate output terminal, the third node, and a fourth clock terminal, and configured to control a potential of the fourth node in response to the voltage level at the first node and the first level signal provided through the first clock terminal, and electrically couple the second level terminal to the intermediate output terminal in response to a potential of the fourth node.

3. The shift register of claim 1, wherein the first output sub-circuit lowers the potential of the third node to a voltage level lower than the first level signal provided through the first level terminal in a reset stage.

4. The shift register of claim 1, wherein the first output sub-circuit comprises:

a pull-up sub-circuit coupled to the intermediate output terminal, the final output terminal, and the second level terminal, and configured to electrically couple the second level terminal to the final output terminal in response to the potential of the intermediate output terminal in an output stage; and a second voltage stabilization sub-circuit coupled to the next-stage node connection terminal, the final output terminal, and the third node, and configured to stabilize the voltage between the final output terminal and the third node in response to the first level signal provided through the next-stage node connection terminal in the output stage and a reset stage.

5. The shift register of claim 4, wherein the second voltage stabilization sub-circuit is further configured to stabilize a voltage between the final output terminal and the third node in response to the first level signal provided through the next-stage node connection terminal in a first pull-down stage after the reset stage.

6. The shift register of claim 1, wherein the control sub-circuit comprises:

a first voltage stabilization sub-circuit coupled to the first node, the second node, and the intermediate output terminal, and configured to, in an input stage, electrically couple the first node and the second node, and stabilize a voltage between the second node and the intermediate output terminal;

a first pull-up control sub-circuit coupled to the intermediate output terminal, the second node, and the second clock terminal, and configured to, in response to a potential of the second node, transmit the second level signal provided through the second clock terminal to the intermediate output terminal in the input stage and a reset stage, and transmit the first level signal provided through the second clock terminal to the intermediate output terminal in an output stage; and a first pull-down control sub-circuit coupled to the intermediate output terminal, the third node, the third clock terminal, the second level terminal, and the first level terminal, and configured to electrically couple the second level terminal and the third node in response to the potential of the intermediate output terminal in the output stage, and electrically couple the first level terminal to the third node in response to the first level signal provided through the third clock terminal in the input stage and the reset stage.

7. The shift register of claim 2, wherein the second output sub-circuit comprises:

a second pull-up control sub-circuit coupled to the first clock terminal, the first node, the first level terminal, and the fourth node, and configured to transmit the second level signal provided through the first clock terminal to the fourth node in response to the voltage level at the first node in an output stage, and electrically couple the first level terminal to the fourth node in response to the first level signal provided through the first clock terminal in a first pull-down stage;

a third pull-up control sub-circuit coupled to the fourth node, the second level terminal and the intermediate output terminal, and configured to electrically couple the second level terminal to the intermediate output terminal in response to the potential of the fourth node in the first pull-down stage and a second pull-down stage;

a third voltage stabilization sub-circuit coupled to the second level terminal and the fourth node, and configured to stabilize a voltage between the second level terminal and the fourth node; and a fourth pull-up control sub-circuit coupled to the fourth node, the second clock terminal, the first node, and the second level terminal, and configured to electrically couple the second level terminal to the first node in response to the potential of the fourth node and the first level signal provided through the second clock terminal in the second pull-down stage.

8. The shift register of claim 1, further comprising: a second pull-down control sub-circuit coupled to the intermediate output terminal, the third node, and the fourth clock terminal, and configured to stabilize, in response to the potential of the fourth node and the potential of the intermediate output terminal, a voltage between the third node and the fourth clock terminal in a case where a signal provided through the fourth clock terminal transits from the second level signal in a first pull-down stage to the first level signal in a second pull-down stage.

9. The shift register of claim 1, wherein the input sub-circuit comprises a first transistor, a gate electrode of the first transistor being coupled to the first clock terminal, a first electrode of the first transistor being coupled to the input terminal of the shift register, and a second electrode of the first transistor being coupled to the first node.

10. The shift register of claim 6, wherein the first voltage stabilization sub-circuit comprises a first capacitor and a second transistor, a first terminal of the first capacitor is coupled to the second node, and a second terminal of the first capacitor is coupled to the intermediate output terminal, and a gate electrode of the second transistor is coupled to the first level terminal, a first electrode of the second transistor is coupled to the second node, and a second electrode of the second transistor is coupled to the first node.

11. The shift register of claim 6, wherein the first pull-up control sub-circuit comprises a third transistor, a gate electrode of the third transistor being coupled to the second node, a first electrode of the third transistor being coupled to the intermediate output terminal, and a second electrode of the third transistor being coupled to the second clock terminal.

12. The shift register of claim 4, wherein the pull-up sub-circuit comprises a fourth transistor, a gate electrode of the fourth transistor being coupled to the intermediate output terminal, a first electrode of the fourth transistor being coupled to the second level terminal, and a second electrode of the fourth transistor being coupled to the final output terminal.

13. The shift register of claim 6, wherein the first pull-down control sub-circuit comprises a fifth transistor and a sixth transistor,
   a gate electrode of the fifth transistor is coupled to the intermediate output terminal, a first electrode of the fifth transistor is coupled to the second level terminal, and a second electrode of the fifth transistor is coupled to the third node, and
   a gate electrode of the sixth transistor is coupled to the third clock terminal, a first electrode of the sixth transistor is coupled to the third node, and a second electrode of the sixth transistor is coupled to the first level terminal.

14. The shift register of claim 6, wherein the first voltage stabilization sub-circuit comprises a second capacitor and a seventh transistor,
   a gate electrode of the seventh transistor is coupled to the next-stage node connection terminal, a first electrode of the seventh transistor is coupled to the final output terminal, a second electrode of the seventh transistor is coupled to a first terminal of the second capacitor, and a second terminal of the second capacitor is coupled to the third node.

15. The shift register of claim 7, wherein the third voltage stabilization sub-circuit comprises a third capacitor, a first terminal of the third capacitor being coupled to the fourth node, and a second terminal of the third capacitor being coupled to the second level terminal.

16. The shift register of claim 7, wherein the third pull-up control sub-circuit comprises a tenth transistor, a gate electrode of the tenth transistor being coupled to the fourth node, a first electrode of the tenth transistor being coupled to the second level terminal, and a second electrode of the tenth transistor being coupled to the intermediate output terminal.

17. The shift register of claim 8, wherein the second pull-down control sub-circuit comprises an eleventh transistor, a twelfth transistor and a fourth capacitor,
   a gate electrode of the eleventh transistor is coupled to the fourth node, a first electrode of the eleventh transistor is coupled to a first terminal of the fourth capacitor, and a second electrode of the eleventh transistor is coupled to a first electrode of the twelfth transistor, and
   a gate electrode of the twelfth transistor and a second terminal of the fourth capacitor are both coupled to the third node, and a second electrode of the twelfth transistor is coupled to the fourth clock terminal.

18. A driving method of the shift register of claim 1, comprising:
   in an input stage, providing the first level signal to the first clock terminal, providing the first level signal to the input terminal, providing the second level signal to the second clock terminal, and providing the first level signal to the third clock terminal;
   in an output stage, providing the second level signal to the first clock terminal, providing the first level signal to the second clock terminal, and providing the second level signal to the third clock terminal; and
   in a reset stage, providing the second level signal to the first clock terminal, providing the second level signal to the second clock terminal, providing the first level signal to the third clock terminal, and lowering a potential of the third node to be lower than a voltage level of the first level signal provided through the first level terminal.

19. The driving method of claim 18, further comprising:
   in the output stage, transmitting the second level signal provided through the first clock terminal to the fourth node by the second pull-up control sub-circuit; and
   after the reset stage:
   in a first pull-down stage, providing the first level signal to the first clock terminal, providing the second level signal to the second clock terminal, providing the first level signal to the third clock terminal, and electrically coupling, by the second pull-up control sub-circuit, the first level terminal to the fourth node, and
   in a second pull-down stage, providing the second level signal to the first clock terminal, providing the first level signal to the second clock terminal, providing the second level signal to the third clock terminal, maintaining, by the third voltage stabilization sub-circuit, a potential of the fourth node to be the same as that in the first pull-down stage, and maintaining, by the second pull-down control sub-circuit, a voltage between the third node and the fourth clock terminal to be the same as that in the first pull-down stage,
   wherein the first pull-down stage and the second pull-down stage occur alternately.

20. A display device, comprising a gate driving circuit, the gate driving circuit comprising N cascaded shift registers, each of the shift registers being the shift register of claim 1, wherein the intermediate output terminal of each of the 1st shift register to the (N−1)-th shift register is coupled to the input terminal of a next-stage shift register, and the next-stage node connection terminal of each of the 1st shift register to the (N−1)-th shift register is coupled to the first node of the next-stage shift register.

* * * * *